(12) United States Patent
Shimizu et al.

(10) Patent No.: US 7,864,563 B2
(45) Date of Patent: Jan. 4, 2011

(54) MAGNETIC RANDOM ACCESS MEMORY

(75) Inventors: Yuui Shimizu, Yokohama (JP); Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 394 days.

(21) Appl. No.: 11/863,997

(22) Filed: Sep. 28, 2007

(65) Prior Publication Data

US 2008/0253173 A1 Oct. 16, 2008

Related U.S. Application Data

(63) Continuation of application No. PCT/JP2005/016362, filed on Aug. 31, 2005.

(30) Foreign Application Priority Data

Mar. 31, 2005 (JP) .............................. 2005-101390

(51) Int. Cl.
*G11C 11/02* (2006.01)
*G11C 11/14* (2006.01)
*G11C 11/15* (2006.01)
*G11C 7/14* (2006.01)

(52) U.S. Cl. ........................ 365/158; 365/171; 365/173; 365/210.1; 365/210.14; 365/210.15

(58) Field of Classification Search .................. 365/158, 365/171, 173, 210.1, 210.14, 210.15
See application file for complete search history.

(56) References Cited

U.S. PATENT DOCUMENTS 6,466,471 B1 * 10/2002 Bhattacharyya ............... 365/55

| | | | |
|---|---|---|---|
| 6,512,689 B1 | 1/2003 | Naji et al. | |
| 2003/0031045 A1 * | 2/2003 | Hosotani | 365/158 |
| 2003/0123281 A1 | 7/2003 | Iwata et al. | |
| 2004/0109353 A1 * | 6/2004 | Matsuoka | 365/185.2 |
| 2004/0228198 A1 | 11/2004 | Shimizu | |
| 2006/0146602 A1 * | 7/2006 | Lin et al. | 365/171 |

FOREIGN PATENT DOCUMENTS

JP 2003-257177 A 9/2003
JP 2004-280892 A 10/2004

OTHER PUBLICATIONS

Roy Scheuerlein, et al., "A 10ns Read and Write Non-Volatile Memory Array Using a Magnetic Tunnel Junction and FET Switch in each Cell", ISSCC Digest of Technical Papers, Feb. 2000, pp. 128-129.

* cited by examiner

*Primary Examiner*—J. H. Hur
(74) *Attorney, Agent, or Firm*—Oblon, Spivak, McClelland, Maier & Neustadt, L.L.P.

(57) ABSTRACT

A magnetic random access memory according to an example of the invention comprises a first reference bit line shared by first reference cells, a second reference bit line shared by second reference cells, a first driver-sinker to feed a first writing current, a second driver-sinker to feed a second writing current, and a control circuit which checks data stored in the first and second reference cells line by line, and executes writing simultaneously to all of the first and second reference cells by a uniaxial writing when the data is broken.

19 Claims, 10 Drawing Sheets

ENBLE : Enable signal

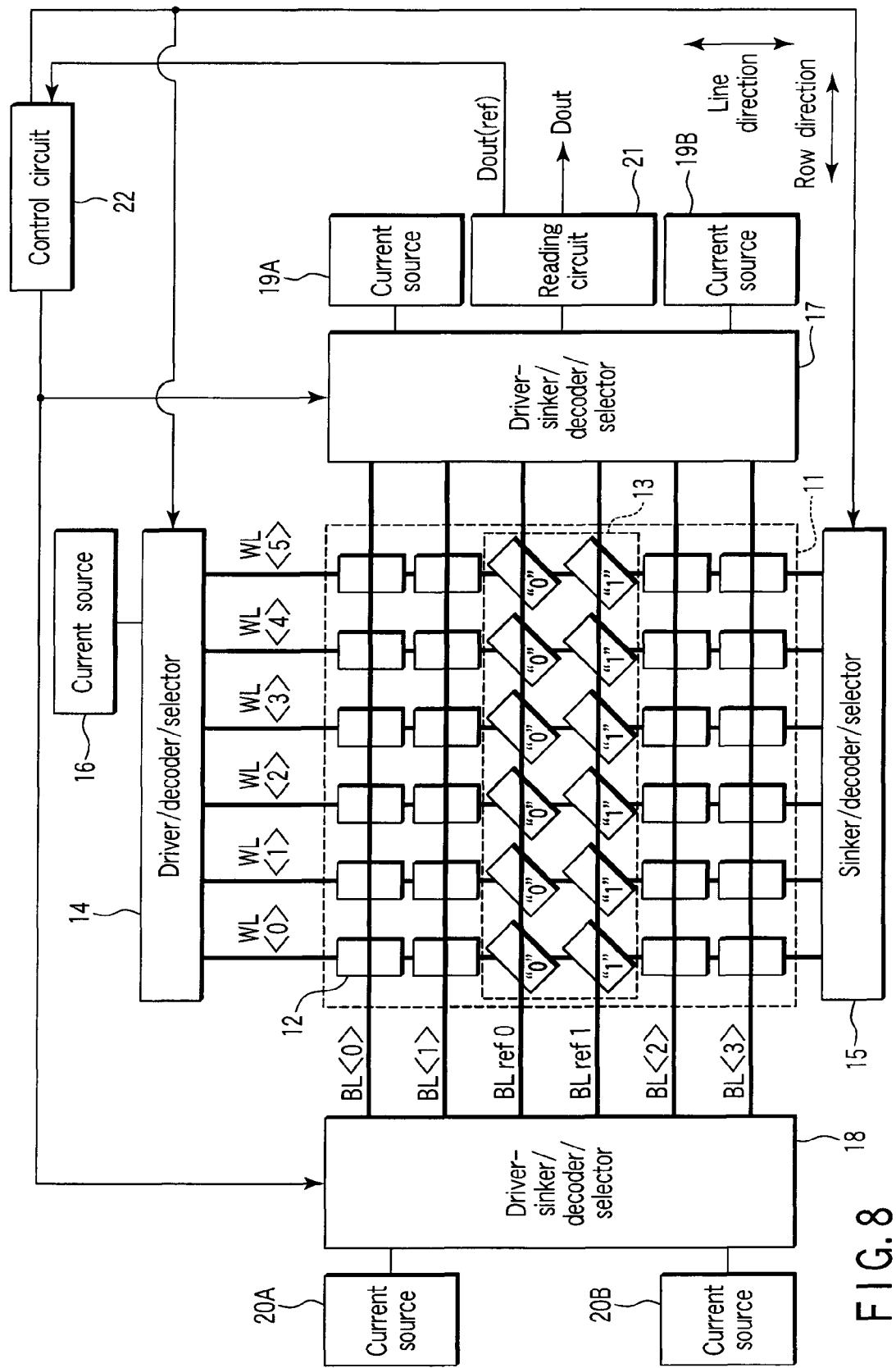
F I G. 8

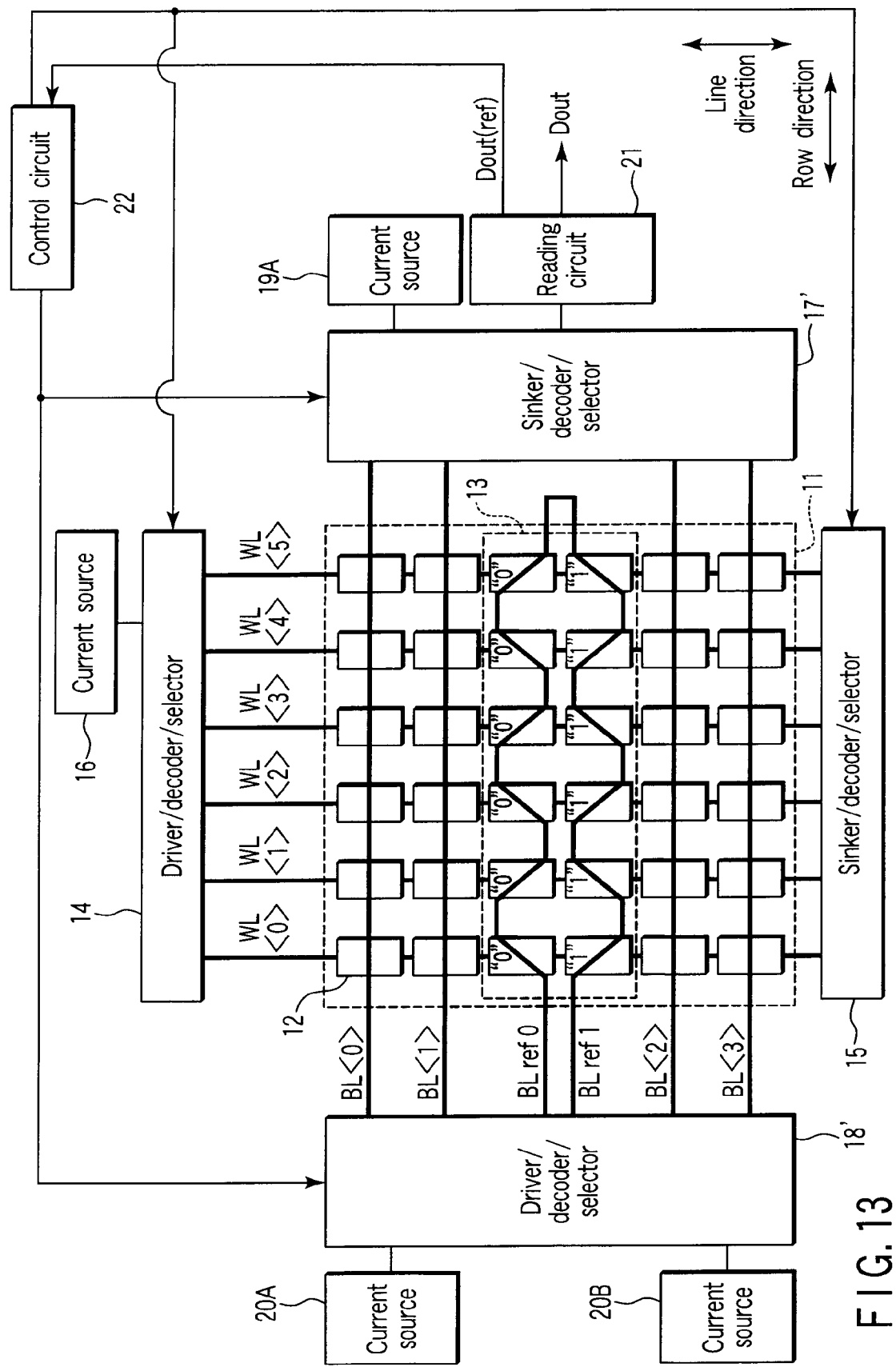
F I G. 13

MAGNETIC RANDOM ACCESS MEMORY

CROSS REFERENCE TO RELATED APPLICATIONS

This is a Continuation Application of PCT Application No. PCT/JP2005/016362, filed Aug. 31, 2005, which was published under PCT Article 21(2) in English.

This application is based upon and claims the benefit of priority from prior Japanese Patent Application No. 2005-101390, filed Mar. 31, 2005, the entire contents of which are incorporated herein by reference.

BACKGROUND OF THE INVENTION

1. Field of the Invention

The present invention relates to a magnetic random access memory (MRAM) making use of tunneling magnetoresistive effects.

2. Description of the Related Art

A magnetic random access memory is nonvolatile, and is capable of writing and reading at high speed, and is hence noticed as a new memory of next generation replacing all existing memories.

Meanwhile, in the magnetic random access memory, a magnetoresistive element, for example, a magnetic tunnel junction (MTJ) element is used as a storage element. Data stored in the magnetoresistive element may be broken due to thermal agitation caused by manufacturing fluctuations or some effects from outside of a chip, and therefore, its countermeasures are needed.

First, a main cell for storing external data can be recovered by introducing an error correction code (ECC) as far as the number of error bits is small. In the magnetic random access memory, a reference cell (magnetoresistive element) of the same composition as the main cell is used in generation of a reference electric potential used when reading out the data to be stored in the main cell.

Since it is similarly possible that the data in the reference cell may be broken, the data in the reference cell must be checked periodically. If the data is broken, it must be recovered.

At the time of data recovery, a busy signal becomes "H", and the operation in the chip is limited. This is a so-called busy state, and data writing/reading operation is prohibited.

In this period, in every word line, data of reference cells (pair) is read out in reference bit lines. Different from ordinary data reading, the value of data of reference cells (pair) is determined individually without shorting reference bit lines.

If the read-out data is normal, word lines are incremented sequentially, and reading continues up to a final word line.

On the other hand, if the read-out data is broken, data recovery operation, that is, writing operation is executed in every reference cells (pair) overlapping with the word line.

When reading (also data recovery operation if necessary) is over in all the word lines, data recovery is terminated, and the busy signal is set to "L", and the busy state is canceled.

Here are two problems, one is that data of all the reference cells must be always checked at the time of data recovery, and the other is that when data breakage in the reference cell is discovered, the recovery operation must be executed every time on that reference cell.

Considering the fundamental cause of these two problems, writing on the magnetoresistive element including the reference cell is performed by a biaxially writing system, that is, by using a synthesized magnetic field of a magnetic field Heasy in a direction of an axis of easy magnetization and a magnetic field Hhard in a direction of an axis of hard magnetization.

In other words, in the case of the biaxially writing system, writing is executed only on the magnetoresistive element existing at the intersection of the word line and the bit line. Therefore, the data recovery of the reference cell must be checked in line unit, and recovery operation must be done accordingly.

It hence takes a longer time in data recovery of the reference cell, and the busy state is established in this period, and consequently, the performance of the magnetic random access memory deteriorates.

BRIEF SUMMARY OF THE INVENTION

A magnetic random access memory according to an aspect of the present invention comprises: a memory cell array including first reference cells and second reference cells; a first reference bit line shared by the first reference cells; a second reference bit line shared by the second reference cells; a first driver-sinker which feeds a first writing current to the first reference bit line; a second driver-sinker which feeds a second writing current to the second reference bit line; and a control circuit which checks data stored in the first and second reference cells line by line, and executes data writing in all of the first and second reference cells by a uniaxial writing when the data is broken.

BRIEF DESCRIPTION OF THE SEVERAL VIEWS OF THE DRAWING

FIG. 8 is a block diagram showing a magnetic random access memory according to a second embodiment of the invention;

FIG. 13 is a block diagram showing s magnetic random access memory according to a fifth embodiment of the invention;

DETAILED DESCRIPTION OF THE INVENTION

A magnetic random access memory of an aspect of the present invention will be described below in detail with reference to the accompanying drawings.

1. Outline

An example of the invention relates to a magnetic random access memory having a function of checking data of reference cell periodically even after shipping of a product for detecting data breakdown of the reference cell to be employed in generation of a reference electric potential for use in data reading, and recovering the data if the data is broken.

In such a magnetic random access memory, the example of the invention proposes a technique of recovering data in batch in reference cells which store the same data, thereby substantially shortening the time required for recovery of reference cells.

Specifically, a reference electric potential is generated by a pair of a reference cell for storing "0", and a reference cell for storing "1". Therefore, by using a uniaxial writing system of executing writing by use of only a magnetic field generated by a current flowing in one writing line at the time when data breakdown is discovered, "0" or "1" is written in batch in the reference cells storing the same data.

Figure 1:
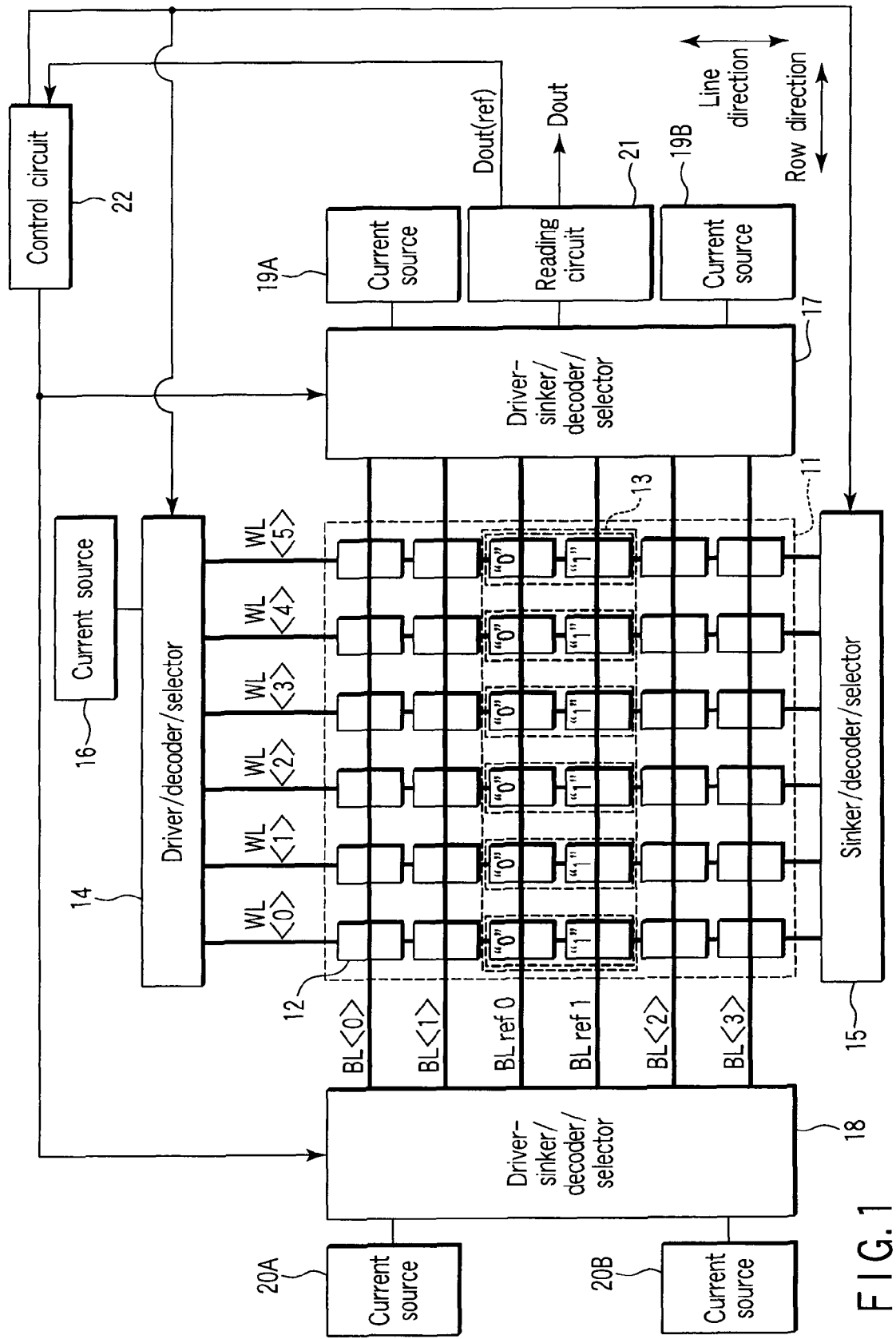
FIG. 1 is a block diagram showing a magnetic random access memory according to a first embodiment of the invention.

FIG. 1 shows a magnetic random access memory having a reference cell data recovery function.

A memory cell array 11 is composed of a plurality of magnetoresistive elements 12 arranged in array. For the sake of simplicity, the memory cell array 11 is arranged in 6 lines×6 rows, but the size of the memory cell array 11 can be freely changed.

In the example of the invention, the cell structure is not particularly specified. For example, the cell structure may be a cross point type or a ladder type, or a structure having a selection element, for example, 1Tr-1MTJ type consisting of one selection element and one storage element, or 1Tr-nMTJ type consisting of one selection element and n (n is a plural number) storage elements.

Of the plurality of magnetoresistive elements 12 for composing the memory cell array 11, for example, the magnetoresistive elements 12 for composing certain two predetermined rows are employed in generation of a reference electric potential for use in data reading. Herein, the magnetoresistive element 12 for use in generation of the reference electric potential is called a reference cell 13.

Word lines WL<0>, WL<1>, ... WL<5> extend in a line direction, and a driver/decoder/selector 14 is connected to one end of each of the word lines, and a sinker/decoder/selector 15 is connected to the other end thereof.

A current source 16 generates a writing current when writing data. For example, the writing current generated by the current source 16 is supplied to one word line WL<i> selected by the driver/decoder/selector 14 and the sinker/decoder/selector 15.

Bit lines BL<0>, BL<1>, ... BL<3>, BLref0, BLref1 extend in a row direction, and a driver-sinker/decoder/selector 17 is connected to one end of each of the bit lines, and a driver-sinker/decoder/selector 18 is connected to the other end thereof.

Current sources 19, 20 generate a writing current when writing data. For example, the writing current generated by the current sources 19, 20 is supplied to one bit line BL<j> selected by the driver-sinker/decoder/selectors 17, 18. That is, in the bit line BL<j>, a writing current in a direction depending on the writing data value flows.

Of the plurality of bit lines BL<0>, BL<1>, ... BL<3>, two bit lines for use in writing of data in the reference cell 13 are called reference bit lines BLref0, BLref1.

A reading circuit 21 determines a value of data stored in the selected magnetoresistive element 12 on the basis of the reference electric potential generated by the reference cell 13, and issues the data as output data Dout.

A control circuit 22 controls, for example, data writing/reading operation. Further, at the time of recovery of data of the reference cell 13, the control circuit 22 recovers the data of the reference cell 13 on the basis of the data read out from the reference cell 13.

That is, in the example of the invention, a uniaxial writing system of writing by using a magnetic field of one direction is employed at least in the reference cell 13. In this case, for example, in the reference cells 13 composing one row, data is written in batch at the same time. However, since the same data is stored in the reference cells 13 composing one row, there is no problem.

By employing such a technique, when data breakage is discovered, data can be recovered in batch in all the reference cells 13, so that it is not needed to check data of all the reference cells 13.

Therefore, according to the example of the invention, the time required for recovery of reference cells can be shortened substantially.

2. Embodiments

Some of the best modes for carrying out the invention will be explained below. The line direction and row direction are mutually orthogonal directions, but are not specified in a vertical or lateral direction.

First Embodiment

1) Overall Configuration

FIG. 1 shows a magnetic random access memory having a function of recovering reference cell data according to a first embodiment of the invention.

A memory cell array 11 is composed of a plurality of magnetoresistive elements 12 arranged in array. For the sake of simplicity, the memory cell array 11 is arranged in 6 lines×6 rows, but the size of the memory cell array 11 can be freely changed.

Also in the example of the invention, same as explained in the reference example above, the cell structure is not particularly limited.

Of the plurality of magnetoresistive elements 12 which compose the memory cell array 11, for example, the magnetoresistive elements 12 which compose certain two predetermined rows are used as reference cells 13, and used in generation of a reference electric potential for data reading.

Word lines WL<0>, WL<1>, ... WL<5> extend in the line direction, and a driver/decoder/selector 14 is connected to one end of each of the word lines, and a sinker/decoder/selector 15 is connected to the other end thereof.

A current source 16 generates a writing current to the magnetoresistive elements 12 except for the reference cells 13 when writing data. For example, the writing current generated by the current source 16 is supplied to one word line WL<i> selected by the driver/decoder/selector 14 and the sinker/decoder/selector 15.

Bit lines BL<0>, BL<1>, . . . BL<3>, BLref0, BLref1 extend in the row direction, and a driver-sinker/decoder/selector 17 is connected to one end of each of the bit liens, and a driver-sinker/decoder/selector 18 is connected to the other end thereof.

Current sources 19A, 20A generate a writing current to the magnetoresistive elements 12 except for the reference cells 13 when writing data. For example, the writing current generated by the current sources 19A, 20A is supplied to one bit line BL<j> selected by the driver-sinker/decoder/selectors 17, 18. That is, in the bit line BL<j>, a writing current in a direction depending on the writing data value flows.

In the first embodiment, data is written in the reference cells 13 by the uniaxial writing system.

Therefore, in data writing on the reference cells 13, only the magnetic field generated by the writing current flowing in the reference bit lines BLref0, BLref1 is used.

Accordingly, at the time of data writing in the reference cells 13, a writing current is generated by using new current sources 19B, 20B which are different from the current sources 19A, 20A.

Figure 2:
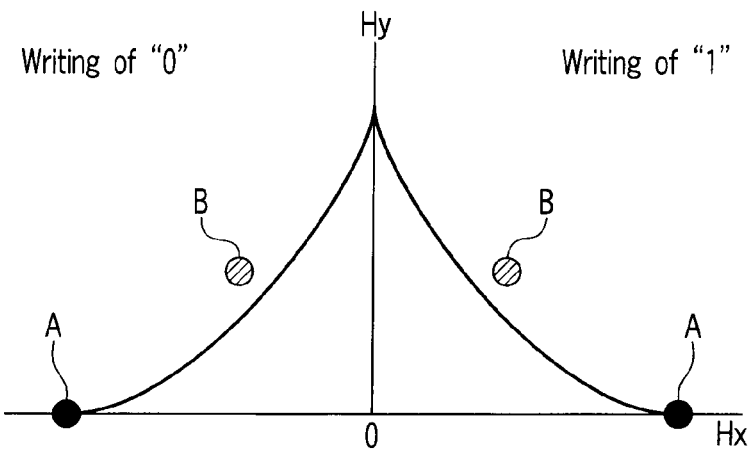
FIG. 2 is a view for explaining an inverted magnetic field of a reference cell in a Stoner-Wohlfarth model.

Specifically, as clear from a Stoner-Wohlfarth model in FIG. 2, since the size of a magnetic field Hx (point A) necessary for causing inversion of magnetization in the uniaxial writing system is larger than each size of a synthesized magnetic field Hx+Hy (point B) used in the biaxial writing system, the size of the writing current generated by the current sources 19B, 20B is also set larger than the size of the writing current generated by the current sources 19A, 20A.

In reference cells 13 overlapping with the reference bit line BLref0, data "0" is written in batch by using the uniaxial writing system at the time of data recovery. That is, the writing current generated by the current source 19B is caused to flow in the reference bit line BLref0 from the driver-sinker/decoder/selector 17 to the driver-sinker/decoder/selector 18.

In reference cells 13 overlapping with the reference bit line BLref1, data "1" is written in batch by using the uniaxial writing system at the time of data recovery. That is, the writing current generated by the current source 20B is caused to flow in the reference bit line BLref1 from the driver-sinker/decoder/selector 18 to the driver-sinker/decoder/selector 17.

Driving force (size) of a driver (for example, an MOS transistor) for driving the reference bit lines BLref0, BLref1 is set larger than driving force (size) of a driver (for example, a MOS transistor) for driving the bit lines BL<0>, BL<1>, . . . BL<3> for realizing uniaxial writing using the writing current by the current sources 19B, 20B.

A reading circuit 21 determines a value of data stored in the selected magnetoresistive element 12 on the basis of the reference electric potential generated by the reference cells 13, and issues the data as output data Dout.

A control circuit 22 controls, for example, data writing/reading operation. Further, at the time of recovery of data of the reference cells 13, the control circuit 22 controls the operation of an internal circuit including the driver/decoder/selector 14, sinker/decoder/selector 15, and driver-sinker/decoder/selectors 17, 18, in accordance with a recovery sequence of reference cell data described below.

2) Reading Circuit

An example of the reading circuit will be explained.

In the first embodiment, the reading circuit 21 has a different configuration from the reference example in order to execute recovery of the reference cells 13.

Figure 3:
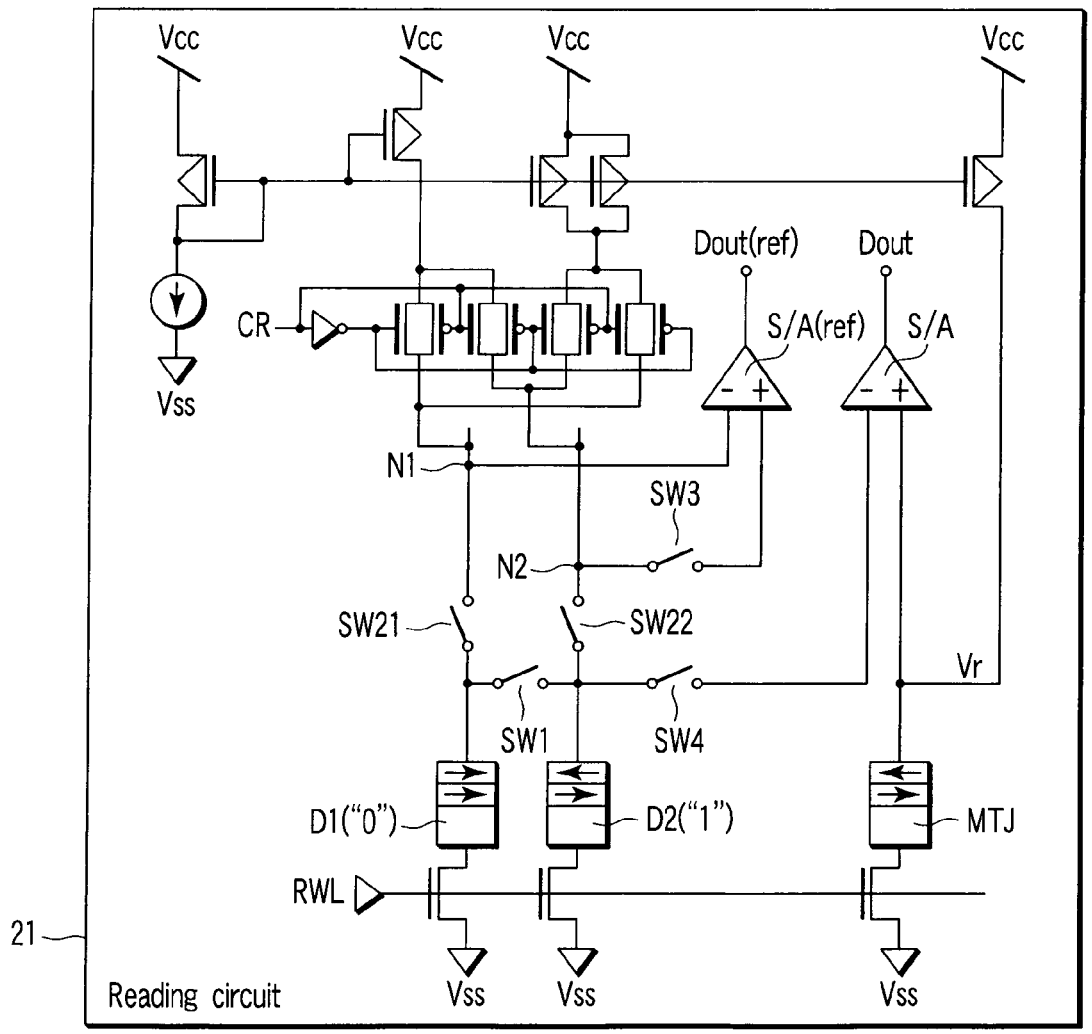
FIG. 3 is a circuit diagram showing an example of a reading circuit.

FIG. 3 shows an example of the reading circuit.

The reading circuit 21 is featured in that it comprises a sense amplifier S/A for determining a value of data of an MTJ element MTJ at the time of ordinary data reading, and a sense amplifier S/A (ref) for determining a value of data of reference cells D1, D2 at the time of data recovery of the reference cells D1, D2.

Herein, the MTJ element MTJ corresponds to the magnetoresistive element 12 in FIG. 1, and the reference cells D1, D2 correspond to the reference cells (pair) in FIG. 1. For example, "0" is stored in the reference cell D1, and "1" is stored in the reference cell D2.

At the time of ordinary data reading, switches SW21, SW3 are turned off, and switches SW1, SW22, and SW4 are turned on.

When a control signal CR becomes "L", for example, a reading current I' (=I×2) flows in the reference cells D1, D2, and a reference electric potential Vref is generated. The reference electric potential Vref is inputted into a minus side input terminal of the sense amplifier S/A.

Further, for example, a reading current I flows in the MTJ element MTJ to be read out, and a reading electric potential Vr according to data stored in the MTJ element MTJ is inputted into a plus side input terminal of the sense amplifier S/A.

The sense amplifier S/A compares the reference electric potential Vref and the reading electric potential Vr with each other, and determines the data of the MTJ element MTJ.

At the time of data recovery of the reference cells D1, D2, the switches SW1, SW4 are turned off, and the switches SW21, SW22, and SW3 are turned on.

First, the control signal CR is set to "L", and, for example, the reading current I flows in the reference cell D1, and the reading current I' (>I), for example, reading current I×2 flows in the reference cell D2. At this time, when the data of the reference cell D1 is "0" (parallel state), or the data of the reference cell D2 is "1" (antiparallel state), it is free from data breakdown, and an electric potential generated in a node N1 is Rp×I, and an electric potential generated in a node N2 is Ra×I'.

Herein, RP is a resistance value of the MTJ element MTJ in the parallel state, and Ra is a resistance value of the MTJ element MTJ in the antiparallel state.

When the data of the reference cell D1 is "1", and the data is broken, the electric potential generated in the node N1 is Ra×I, and when the data of the reference cell D2 is "0", and the data is broken, the electric potential generated in the node N2 is Rp×I'.

Figure 4:
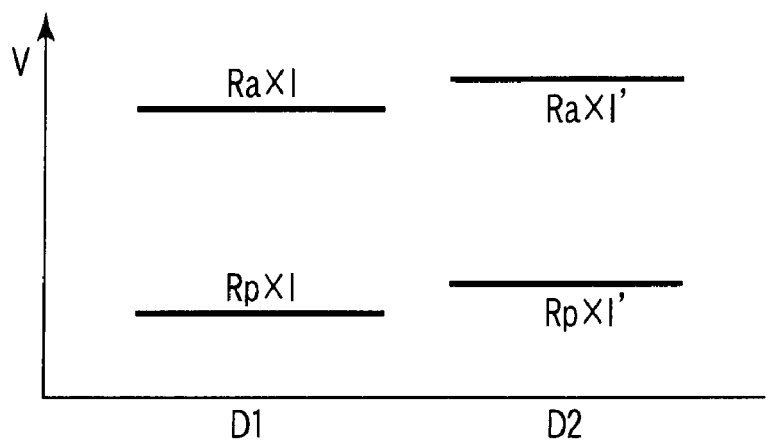
FIG. 4 is a diagram showing a pattern of a reading electric potential from the reference cell.

The size of a P channel MOS transistor as a current source is determined such that the electric potentials Rp×I, Ra×I', Ra×I, Rp×I' generated in the nodes N1, N2 may be, for example, in the relation as shown in FIG. 4.

The sense amplifier S/A (ref) is set in its sensitivity so as to issue H (=OK) only when the electric potential inputted to the minus side input terminal is Rp×I and the electric potential inputted to the plus side input terminal is Ra×I', and so as to issue L (=NG) otherwise.

Alternatively, the control signal CR is set to H, and, for example, the reading current I' (>I) flows in the reference cell D1, for example, reading current I×2 flows, and the reading current I flows in the reference cell D2. At this time, when the data of the reference cell D1 is "0" (parallel state), or the data of the reference cell D2 is "1" (antiparallel state), it is free from data breakdown, and the electric potential generated in the node N1 is Rp×I', and the electric potential generated in the node N2 is Ra×I.

When the data of the reference cell D1 is "0", and the data is broken, the electric potential generated in the node N1 is Rp×I', and when the data of the reference cell D2 is "1", and the data is broken, the electric potential generated in the node N2 is Ra×I.

The size of the P channel MOS transistor as a current source is determined such that the electric potentials Rp×I, Ra×I', Ra×I, Rp×I' generated in the nodes N1, N2 may be, for example, in the relation as shown in FIG. 4.

The sense amplifier S/A (ref) is set in its sensitivity so as to issue H (=OK) only when the electric potential inputted to the minus side input terminal is Rp×I' and the electric potential inputted to the plus side input terminal is Ra×I, and so as to issue L (=NG) otherwise.

Figure 5:
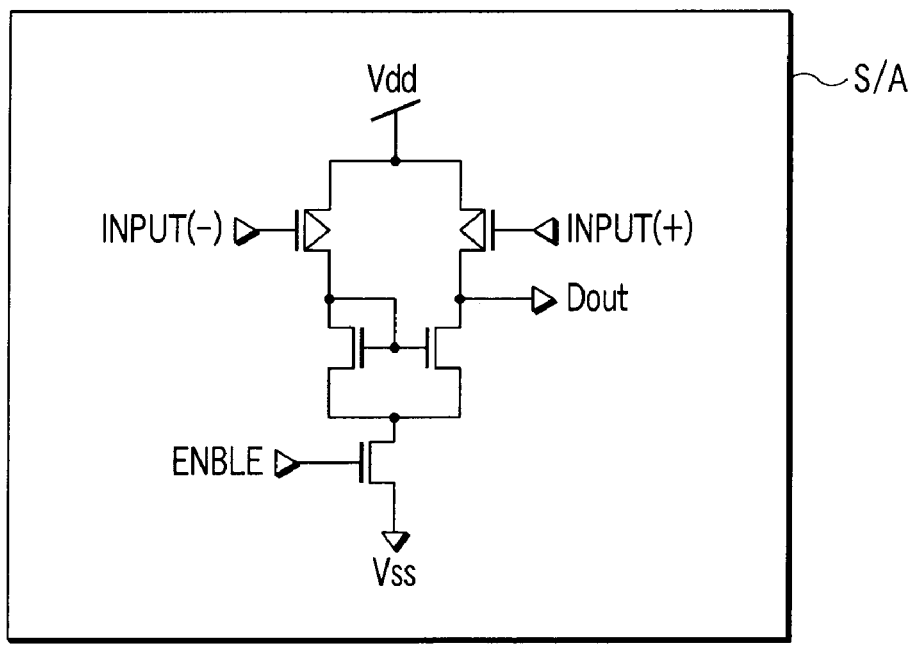
FIG. 5 is a circuit diagram showing an example of a sense amplifier for memory cell data.
Figure 6:
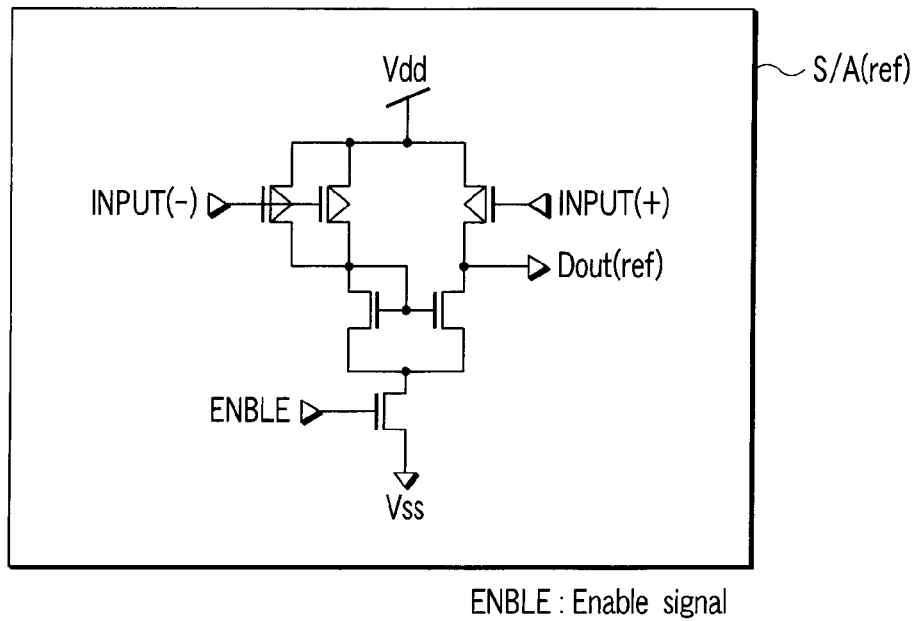
FIG. 6 is a circuit diagram showing an example of a sense amplifier for reference cell data.

As the sense amplifier S/A, for example, a differential amplifier shown in FIG. 5 may be used, or as the sense amplifier S/A (ref), for example, a differential amplifier shown in FIG. 6 may be used.

The sense amplifiers S/A and S/A (ref) may be identical in configuration.

3) Data Recovery Operation

Figure 7:
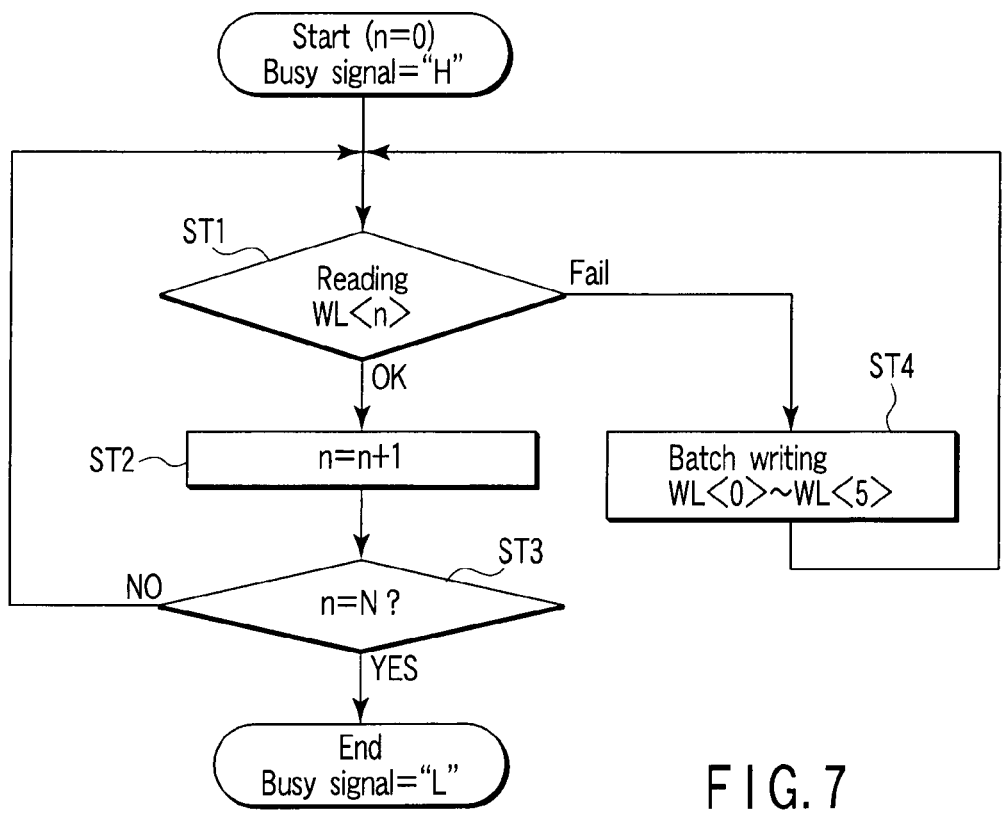
FIG. 7 is a flowchart showing an example of data recovery operation.

FIG. 7 is a flowchart of data recovery operation of reference cells according to the first embodiment.

This data recovery operation will be specifically described below.

As a preliminary condition, data "0" is stored in the reference cell 13 overlapping with the reference bit line BLref0, and data "1" is stored in the reference cell 13 overlapping with the reference bit line BLref1.

In this case, when reading out data, data of two reference cells (pair) 13 selected by the selected word line WL<1> or different reading word line are read out in the reference bit lines BLref0, BLref1.

More specifically, data "0" is read out in the reference bit line BLref0, and data "1" is read out in the reference bit line BLref1. Therefore, by short-circuiting, for example, the two reference bit lines BLref0, BLref1, a reference electric potential can be generated.

Data recovery of the reference cell 13 is executed on a certain specified timing, such as at the time of power on.

At the time of data recovery of the reference cell 13, the busy signal becomes "H", and the operation in the chip is limited. This is the busy state, and data writing/reading operation is prohibited.

First, being set at n=0, the data of the reference cells (pair) 13 overlapping with the word line WL<0> are read out in the reference bit lines BLref0, BLref1. Herein, at the time of data recovery of the reference cells 13, different from ordinary data reading, data values of the reference cells (pair) 13 are determined (step ST1) without short-circuiting the reference bit lines BLref0, BLref1.

When the data read out in the reference bit line BLref0 is 0 and the data read out in the reference bit line BLref1 is 1, for example, the output data Dout (ref) of the reading circuit 21 in FIG. 3 is "H".

Therefore, the control circuit 22 in FIG. 1 recognizes that the data of the reference cells 13 is normal, and thus, increments the line address by one (n=n+1). If the line address does not reach the maximum value N, the data of the reference cells (pair) 13 overlapping with the next word line WL<1> are read out in the reference bit lines BLref0, BLref1 (steps ST2 to ST3).

When the line address reaches the maximum value N, it means data checking is complete in all the reference cells 13. Therefore, data recovery operation of the reference cells 13 is finished, and the busy signal is changed to "L" to cancel the busy state.

On the other hand, if the data read out in the reference bit line BLref0 is not determined to be "0", or the data read out in the reference bit line BLref1 is not determined to be "1", for example, the output data Dout (ref) of the reading circuit 21 in FIG. 3 becomes "L".

Therefore, the control circuit 22 in FIG. 1 recognizes that the data is broken in the reference cells 13. Hence, data recovery operation, that is, writing operation is executed on all the reference cells (pair) 13 (step ST4).

In the first embodiment, different from the reference example, data recovery is executed on all the reference cells (pair) 13 from the moment of discovery of data breakdown without recovering data in line unit.

Specifically, for example, in the reference bit line BLref0, a writing current flowing from the driver-sinker/decoder/selector 17 to the driver-sinker/decoder/selector 18 is fed, whereby data "0" is written in batch in all the reference cells (pair) 13 overlapping with the reference bit line BLref0 by means of the uniaxial writing system.

In the reference bit line BLref1, a writing current flowing from the driver-sinker/decoder/selector 18 to the driver-sinker/decoder/selector 17 is fed, whereby data "1" is written in batch in all the reference cells (pair) 13 overlapping with the reference bit line BLref1 by means of the uniaxial writing system.

As a result, data "0" is written in all the reference cells 13 overlapping with the reference bit line BLref0, and data "1" is written in all the reference cells 13 overlapping with the reference bit line BLref1.

Thus, data recovery operation according to the first embodiment is same as that in the reference example in that the data of the reference cells (pair) 13 is checked line by line, but is largely different from that in the reference example in that data recovery by the uniaxial writing system is executed in all the reference cells 13 from the moment of discovery of data breakdown, thereby skipping data checking of the subsequent reference cells 13.

4) Summary

Therefore, the first embodiment can substantially shorten the time required for recovery of reference cells.

Second Embodiment

A magnetic random access memory according to a second embodiment is a modified example of the magnetic random access memory according to the first embodiment.

1) Overall Configuration

FIG. 8 shows a magnetic random access memory having a function of recovering reference cell data according to the second embodiment.

The second embodiment is different from the first embodiment in that the direction of reference cells 13 is different from the direction of a magnetoresistive element 12 for storing data other than the reference cells 13.

As for the magnetoresistive element 12 in which data is written by the biaxial writing system, for example, the axis of easy magnetization is arranged in the line direction, that is, the extending direction of the word line WL<i>, and the axis of hard magnetization is arranged in the row direction, that is, the extending direction of the bit line BL<j>.

By contrast, as for the reference cells (magnetoresistive elements) 13 in which data is written by the uniaxial writing system, for example, the axis of easy magnetization is arranged in the line direction, that is, the direction different from the extending direction of the word line WL<i>, and in the row direction, that is, the direction different from the extending direction of the reference bit lines BLref0, BLref1.

That is, the axis of easy magnetization of the reference cells 13 is set to direct in a range of angle θ, for example, to the row direction, that is, 0°<θ<90° (provided that, when θ=90°, the axis of easy magnetization coincides with the line direction).

For example, according to the layout shown in the diagram in which the axis of easy magnetization of the reference cells 13 is 45° to the row direction, the size of a magnetic field necessary for inverting the magnetization of the reference cells 13 can be minimized, and the writing current in the reference cells 13 can be reduced.

At this time, the axis of hard magnetization of the reference cells 13 is orthogonal to the direction of the axis of easy magnetization.

Figure 9:
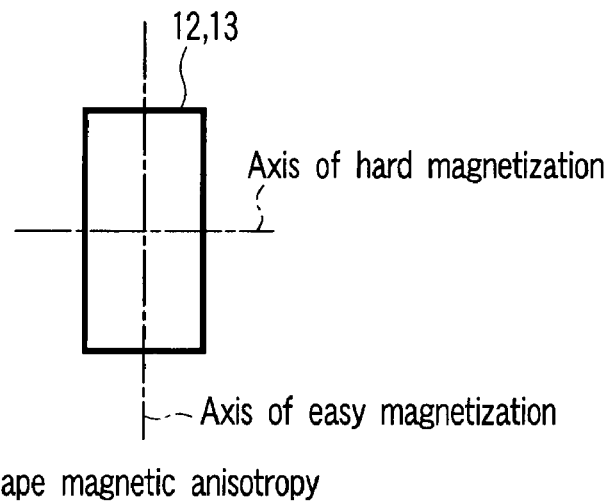
FIG. 9 is an explanatory diagram of shape magnetic anisotropy.

Incidentally, as shown in FIG. 9, when the magnetic anisotropy of the magnetoresistive element 12 is maintained by shape (shape magnetic anisotropy), for example, the magnetoresistive element 12 is in rectangular or similar shape (shape having a longer axis and a shorter axis), in which the longer axis is the axis of easy magnetization, and the shorter axis is the axis of hard magnetization.

As for data writing in the reference cells 13, only the magnetic field generated by the writing current flowing in the reference bit lines BLref0, BLref1 is used.

Accordingly, when writing data in the reference cells 13, a writing current is generated by using the current sources 19B, 20B in the same manner as in the first embodiment.

When writing data "0" in batch in the reference cells 13 overlapping with the reference bit line BLref0, for example, the writing current generated by the current source 19B is fed in the reference bit line BLref0 to flow from the driver-sinker/decoder/selector 17 to the driver-sinker/decoder/selector 18.

When writing data "1" in batch in the reference cells 13 overlapping with the reference bit line BLref1, for example, the writing current generated by the current source 20B is fed in the reference bit line BLref1 to flow from the driver-sinker/decoder/selector 18 to the driver-sinker/decoder/selector 17.

Figure 10:
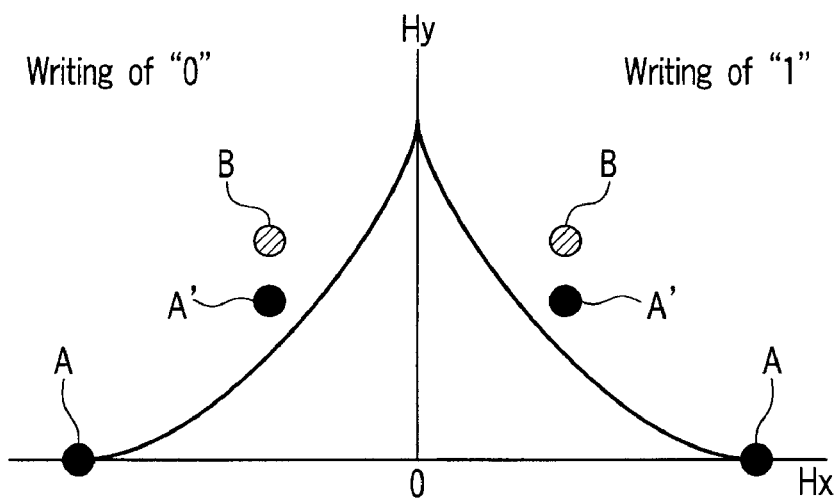
FIG. 10 is a diagram for explaining an inverted magnetic field of a reference cell in a Stoner-Wohlfarth model.

As clear from a Stoner-Wohlfarth model in FIG. 10, in the second embodiment, the size of the magnetic field Hx (point A') necessary for causing inversion of magnetization in the uniaxial writing system is smaller than that (point A) in the first embodiment, so that the writing current caused by the current sources 19B, 20B can be decreased. Accordingly, the size of a driver for feeding a writing current into the reference bit lines BLref0, BLref1 or an MOS transistor used in the sink can be reduced, thereby contributing to increase of memory capacity.

Meanwhile, the size of the magnetic field Hx (point A') necessary for causing inversion of magnetization in the uniaxial writing system may be adjusted to be same as each one of the synthesized magnetic field Hx+Hy (point B) used in the biaxial writing system, or may be adjusted to be different from each other.

2) Reading Circuit

As a reading circuit 21 in FIG. 8, for example, the reading circuit in FIG. 3 explained in the first embodiment may be used as is.

3) Data Recovery Operation

In the magnetic random access memory according to the second embodiment, too, data recovery operation conforms to the flowchart in FIG. 7.

4) Summary

Therefore, the second embodiment can substantially shorten the time required for recovery of reference cells, and also contributes greatly to saving of a writing current in reference cells and reduction of current consumption.

Third Embodiment

A magnetic random access memory according to a third embodiment is a modified example of the magnetic random access memory according to the first and second embodiments.

In the first and second embodiments, as shown in FIGS. 1 and 8, for example, the writing current generated by the current source 19B is fed in the reference bit line BLref0 to flow from the driver-sinker/decoder/selector 17 to the driver-sinker/decoder/selector 18 in order to write data "0" in the reference cells 13 overlapping with the reference bit line BLref0.

Similarly, in order to write data "1" in the reference cells 13 overlapping with the reference bit line BLref1, for example, the writing current generated by the current source 20B is fed in the reference bit line BLref1 to flow from the driver-sinker/decoder/selector 18 to the driver-sinker/decoder/selector 17.

That is, in the first and second embodiments, two current sources 19B, 20B must be newly provided in the chip in order to recover reference cell data. As already mentioned, the writing current required for writing of reference cell data is relatively large because of uniaxial writing. Hence, the required area for the current sources 19B, 20B is also larger, which is not favorable for increase of memory capacity.

In the third embodiment, accordingly, ends of two reference bit lines BLref0, BLref1 are short-circuited, and a writing current is fed in one direction, for example, toward the reference bit line BLref0, and by folding it, a writing current is fed in the reference bit line BLref1 to flow in an opposite direction of the one direction.

As a result, "0" is written in batch in the reference cells 13 overlapping with the reference bit line BLref0, and "1" is written in batch in the reference cells 13 overlapping with the reference bit line BLref1.

1) Overall Configuration

Figure 11:
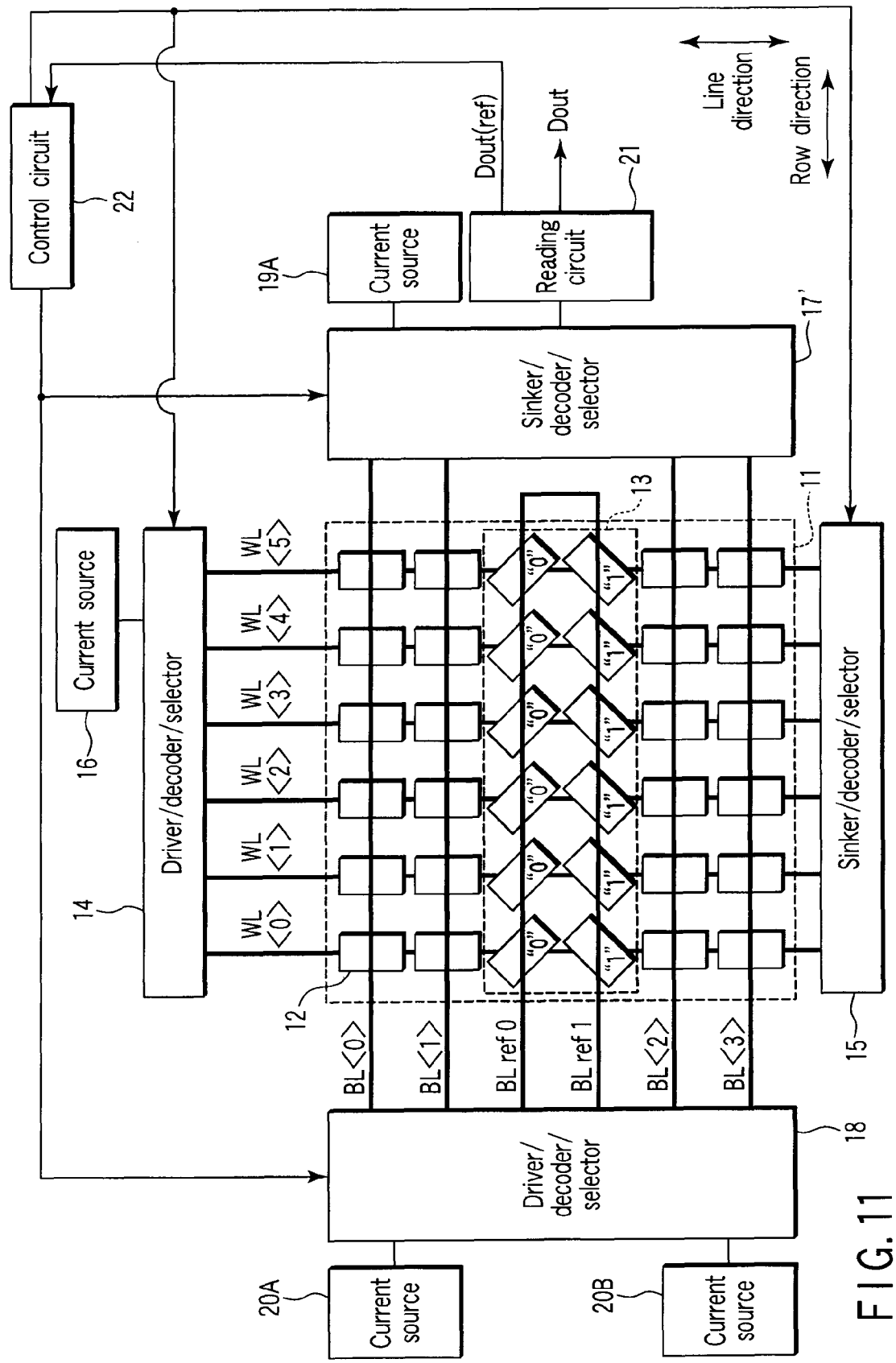
FIG. 11 is a block diagram showing a magnetic random access memory according to a third embodiment of the invention.

FIG. 11 shows a magnetic random access memory having a function of recovering reference cell data according to the third embodiment.

The third embodiment is different from the first and second embodiments in that two reference cells (pair) 13 sharing one word line WL<i> are disposed symmetrically with respect to a line extending in the row direction, and that ends of two reference bit lines BLref0, BLref1 are short-circuited.

As for the magnetoresistive element 12 in which data is written by the biaxial writing system, for example, the axis of easy magnetization is arranged in the line direction, that is, the extending direction of the word line WL<i>, and the axis of hard magnetization is arranged in the row direction, that is, the extending direction of the bit line BL<j>.

By contrast, as for the reference cells (magnetoresistive elements) 13 in which data is written by the uniaxial writing system, for example, the axis of easy magnetization is arranged in the line direction, that is, the direction different from the extending direction of the word line WL<i>, and in the row direction, that is, the direction different from the extending direction of the reference bit lines BLref0, BLref1.

That is, the axis of easy magnetization of the reference cells 13 is set to direct in a range of angle θ, for example, to the row direction, that is, 0°<θ<90° (provided that, when θ=90°, the axis of easy magnetization coincides with the line direction).

The two reference cells (pair) 13 sharing one word line WL<i> are disposed symmetrically with respect to a line extending in the row direction.

For example, according to the layout shown in the diagram, the axis of easy magnetization of the reference cells 13 overlapping with the reference bit line BLref0 is 45° rotated clockwise to the row direction, and the axis of easy magnetization of the reference cells 13 overlapping with the reference bit line BLref1 is 45° rotated counterclockwise to the row direction.

The ends of the reference bit lines BLref0, BLref1 are short-circuited. As a result, the writing current generated by the current source 20B flows in one of the reference bit lines BLref0, BLref1, and is folded at one end, and thereby flows in the other of the reference bit lines BLref0, BLref1.

Therefore, data "0" can be written in batch in the reference cells 13 overlapping with the reference bit line BLref0, and data "1" can be written in batch in the reference cells 13 overlapping with the reference bit line BLref1.

In this case, a sinker/decoder/selector 17' may not have a driver and a sinker for the reference bit lines BLref0, BLref1, and hence the circuit scale can be reduced.

In the third embodiment, only one current source is enough for writing data in the reference cells 13, and the area for a driver/decoder/selector 18' and the sinker/decoder/selector 17' may be smaller than the area for the driver-sinker/decoder/selectors 17, 18 in FIGS. 1 and 8, which contributes to further enhancement of degree of integration, or reduction of the chip area.

2) Reading Circuit

As a reading circuit 21 in FIG. 11, for example, the reading circuit in FIG. 3 explained in the first embodiment may be used as is.

3) Data Recovery Operation

In the magnetic random access memory according to the third embodiment, too, data recovery operation conforms to the flowchart in FIG. 7.

4) Summary

Therefore, the third embodiment can also substantially shorten the time required for recovery of reference cells. At the same time, the third embodiment contributes more than in the first and second embodiments to increase of memory capacity and reduction of the chip area.

Fourth Embodiment

A magnetic random access memory according to a fourth embodiment of the invention is a modified example of the magnetic random access memory of the second embodiment.

In the second embodiment, the direction of the reference cells (magnetoresistive elements) 13 is different from the direction of the magnetoresistive elements 12 for data storage as shown in FIG. 8, thereby reducing the writing current for the reference cells 13.

By contrast, in the fourth embodiment, while all magnetoresistive elements 12 including reference cells 13 are same in direction, reference bit lines BLref0, BLref1 are meandering, whereby the same effect as in the second embodiment can be realized.

1) Overall Configuration

Figure 12:
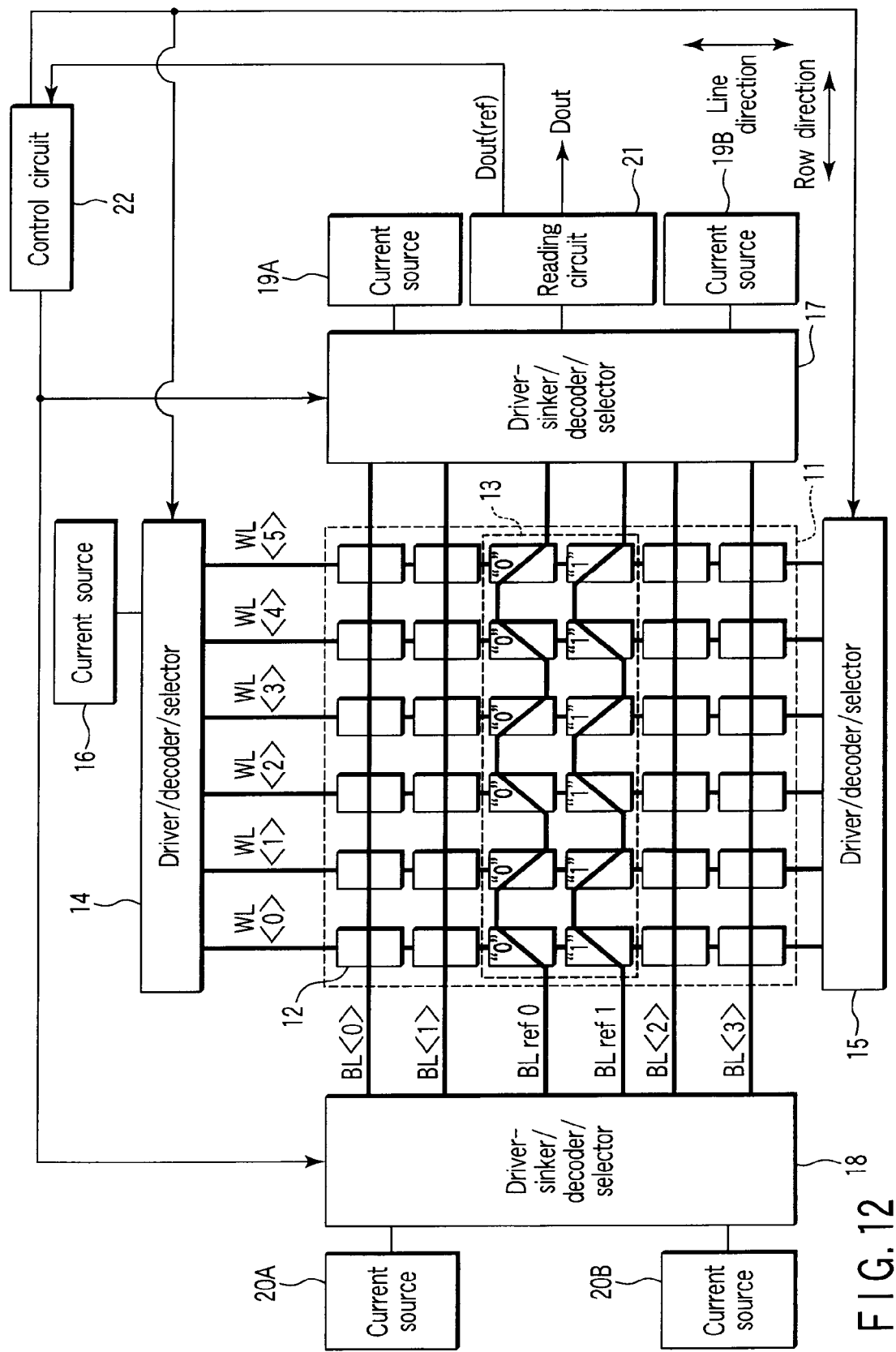
FIG. 12 is a block diagram showing a magnetic random access memory according to a fourth embodiment of the invention.

FIG. 12 shown a magnetic random access memory having a function of recovering reference cell data according to the fourth embodiment.

The fourth embodiment is differ from the second embodiment in that the direction of all the magnetoresistive elements 12 including the reference cells 13 is the same, and that the reference bit lines BLref0, BLref1 are meandering.

All the magnetoresistive elements 12 including the reference cells 13 are disposed in a layout in which, for example, the axis of easy magnetization is arranged in the line direction, that is, the extending direction of the word line WL<i>, and the axis of hard magnetization is arranged in the row direction, that is, the extending direction of the bit line BL<j>.

Bit lines BL<0>, BL<1>, ... BL<4> overlapping with the magnetoresistive elements 12 for data writing by the biaxial writing system extend straightly in the row direction.

By contrast, the reference bit lines BLref0, BLref1 overlapping with the reference cells (magnetoresistive elements) 13 for data writing by the uniaxial writing system extend in the row direction while meandering.

The reference bit lines BLref0, BLref1 are disposed in the same layout.

The axis of easy magnetization of the reference cells 13 is set to direct in a range of angle θ, for example, to the extending direction of the reference bit lines BLref0, BLref1 straightly above the reference cells 13, that is, 0°<θ<90° (provided that, when θ=90°, it is parallel to the reference bit lines BLref0, BLref1).

For example, as shown in the diagram, when the axis of easy magnetization of the reference cells 13 is 45° to the extending direction of the reference bit lines BLref0, BLref1, the size of the magnetic field necessary for inverting the magnetization of the reference cells 13 can be minimized, and the writing current in the reference cells 13 can be reduced.

When writing data "0" in batch in the reference cells 13 overlapping with the reference bit line BLref0, for example, the writing current generated in the current source 19B is fed in the reference bit line BLref0 to flow from the driver-sinker/decoder/selector 17 to the driver-sinker/decoder/selector 18.

Or, when writing data "1" in batch in the reference cells 13 overlapping with the reference bit line BLref1, for example, the writing current generated in the current source 20B is fed in the reference bit line BLref1 to flow from the driver-sinker/decoder/selector 18 to the driver-sinker/decoder/selector 17.

2) Reading Circuit

As a reading circuit 21 in FIG. 12, for example, the reading circuit in FIG. 3 explained in the first embodiment may be used as is.

3) Data Recovery Operation

In the magnetic random access memory in the fourth embodiment, too, data recovery operation conforms to the flowchart in FIG. 7.

4) Summary

Therefore, the fourth embodiment substantially shortens the time required for recovery of reference cells, decreases the value of writing current in reference cells, and contributes to reduction of current consumption.

Fifth Embodiment

A magnetic random access memory according to a fifth embodiment of the invention is a modified example of the magnetic random access memory according to the third embodiment.

In the third embodiment, as shown in FIG. 11, the direction of the reference cells 13 is different from the direction of the magnetoresistive elements 12 for storing data, two reference cells 13 sharing the word line WL<i> are disposed mirror-symmetrically, and further, ends of two reference bit lines BLref0, BLref1 are short-circuited, whereby the writing current for the reference cells 13 is lowered, and the size of the writing circuit is reduced.

By contrast, in the fifth embodiment, while all magnetoresistive elements 12 including reference cells 13 are same in direction, reference bit lines BLref0, BLref1 are meandering, and disposed symmetrically to the line extending in the row direction, and further, ends of two reference bit lines BLref0, BLref1 are short-circuited, so that same effects as in the third embodiment are realized.

1) Overall Configuration

FIG. 13 shows a magnetic random access memory having a function of recovering reference cell data according to the fifth embodiment.

The fifth embodiment is different from the third embodiment in that all the magnetoresistive elements 12 including the reference cells 13 are same in direction, and that the reference bit lines BLref0, BLref1 are meandering, and disposed symmetrically to the line extending in the row direction, and further that the ends of the reference bit lines BLref0, BLref1 are short-circuited.

All the magnetoresistive elements 12 including the reference cells 13 are disposed in a layout in which the axis of easy magnetization is arranged in the line direction, that is, the extending direction of the word line WL<i>, and the axis of hard magnetization is arranged in the row direction, that is, the extending direction of the bit line BL<j>.

Bit lines BL<0>, BL<1>, . . . BL<4> overlapping with the magnetoresistive elements 12 for data writing by the biaxial writing system extend straightly in the row direction.

By contrast, the reference bit lines BLref0, BLref1 overlapping with the reference cells (magnetoresistive elements) 13 for data writing by the uniaxial writing system extend in the row direction while meandering.

Incidentally, the reference bit lines BLref0, BLref1 are arranged to be symmetrical to the line extending in the row direction.

The axis of easy magnetization of the reference cells 13 is set to direct in a range of angle θ, for example, to the extending direction of the reference bit lines BLref0, BLref1 straightly above the reference cells 13, that is, 0°<θ<90° (provided that, when θ=90°, it is parallel to the reference bit lines BLref0, BLref1).

For example, when the axis of easy magnetization of the reference cells 13 is 45° to the extending direction of the reference bit lines BLref0, BLref1 as shown in the diagram, the size of the magnetic field necessary for inverting the magnetization of the reference cells 13 can be minimized, so that the writing current in the reference cells 13 can be reduced.

In the fifth embodiment, the reference bit lines BLref0, BLref1 are arranged to be symmetrical to the line extending in the row direction.

By short-circuiting the ends of the reference bit lines BLref0, BLref1, the writing current generated by the current source 20B flows in one of the reference bit lines BLref0, BLref1, and is folded at one end, and thus flows in the other one of the reference bit lines BLref0, BLref1.

Therefore, data "0" can be written in batch in the reference cells 13 overlapping with the reference bit line BLref0, and data "1" can be written in batch in the reference cells 13 overlapping with the reference bit line BLref1.

In this case, a sinker/decoder/selector 17' may not have a driver and a sinker for reference bit lines BLref0, BLref1, and hence the circuit scale can be reduced.

2) Reading Circuit

As a reading circuit 21 in FIG. 13, for example, the reading circuit in FIG. 3 explained in the first embodiment may be used as is.

3) Data Recovery Operation

In the magnetic random access memory in the fifth embodiment, too, data recovery operation conforms to the flowchart in FIG. 7.

4) Summary

Therefore, the fifth embodiment can also substantially shorten the time required for recovery of reference cells.

At the same time, due to drop of the writing current in reference cells, it contributes reduction of current consumption, and the size of a writing circuit for reference cells is smaller, which also contributes to increase of memory capacity and reduction of the chip size.

3. Memory Cell Structure

In application of examples of the invention, the type of the memory cell structure is not particularly limited as mentioned above, and several examples of memory cell structure are explained below.

Figure 14:
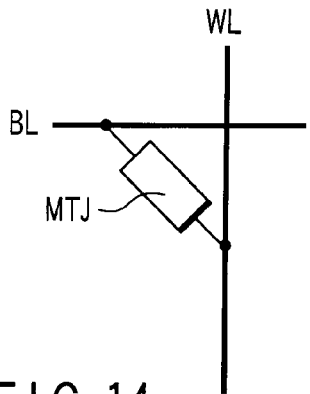
FIG. 14 is a diagram showing a cross point type cell array structure.

A memory cell structure shown in FIG. 14 is a so-called cross point type, in which only one magnetoresistive element MTJ is disposed at the intersection of two writing lines, that is, a word line WL and a bit line BL. According to this structure, since a selection element is not needed, the MTJ elements can be disposed at highest density within a range permitted by lithography, which contributes to increase of memory capacity.

Figure 15:
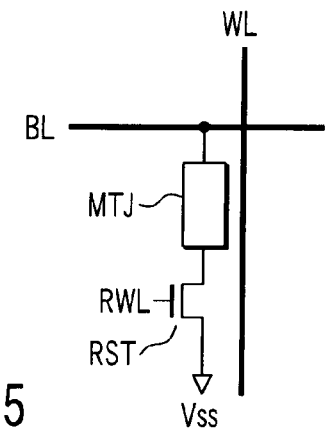
FIG. 15 is a diagram showing a 1Tr-1MTJ type cell array structure.

A memory cell structure shown in FIG. 15 is a so-called 1Tr-1MTJ type having one selection element (MOS transistor) RST connected to one magnetoresistive element MTJ. According to this structure, noise at the time of reading is decreased by the selection element RST, and the reading selectivity can be enhanced.

Figure 16:
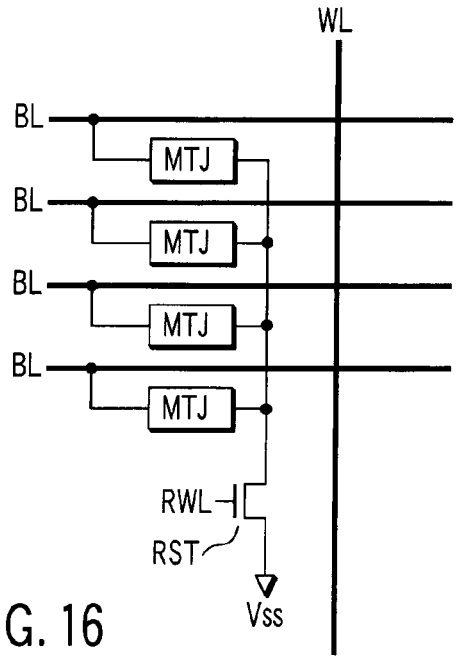
FIG. 16 is a diagram showing the 1Tr-n1MTJ type cell array structure.

A memory cell structure shown in FIG. 16 is a so-called 1Tr-nMTJ type having one selection element (MOS transistor) RST connected to n pieces of (n is a plural number) magnetoresistive elements MTJ. According to this structure, the reading selectivity is enhanced, and high degree of integration close to the cross point type is realized.

Figure 17:
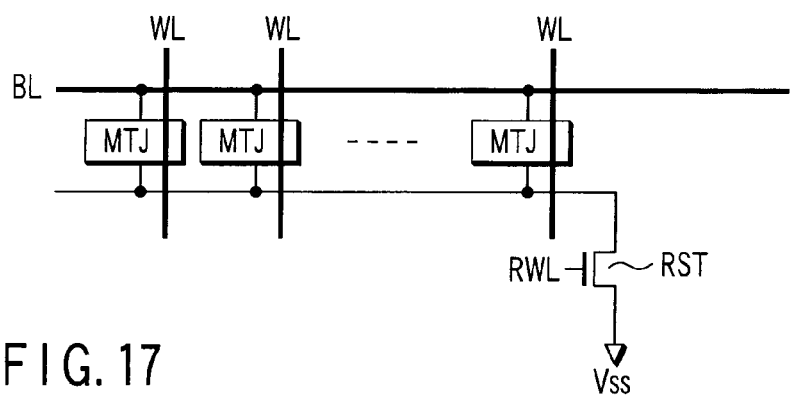
FIG. 17 is a diagram showing a ladder type cell array structure.

A memory cell structure shown in FIG. 17 is a so-called ladder type having a plurality of magnetoresistive elements MTJ connected in ladder. According to this structure, MTJ elements can be disposed nearly at same density as in the cross point type, which contributes to increase of memory capacity. Since the word line WL is used for writing only, and problem of noise in the cross point type can be solved.

The examples of the invention are intended to execute recovery by uniaxial writing in reference cells, and as for magnetoresistive elements for storing data other than reference cells, as far as the magnetic writing system is employed, same effects are obtained by biaxial writing, triaxial writing or uniaxial writing.

4. Others

According to the examples of the invention, in the magnetic random access memory having a function of checking data of reference cells periodically even after shipping of products, and recovering the data if the data is broken, the time required for recovering the reference cells can be substantially shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a memory cell array including magnetoresistive elements as memory cells, the memory cells comprising data cells, first reference cells and second reference cells;
   a first reference bit line shared by the first reference cells;
   a second reference bit line shared by the second reference cells;
   a first driver-sinker which feeds a first writing current to the first reference bit line;
   a second driver-sinker which feeds a second writing current to the second reference bit line; and
   a control circuit which checks data stored in the first and second reference cells line by line, and executes data writing in all of the first and second reference cells by a uniaxial writing when the data is broken,
   wherein data writing is executed in a biaxial writing to the data cells.

2. The magnetic random access memory according to claim 1, wherein the first and second reference bit lines extend straightly in a row direction, and an axis of easy magnetization of the first and second reference cells is directed at an angle of θ (0<θ<90°) to the row direction.

3. The magnetic random access memory according to claim 2, wherein a layout of the first and second reference cells is different from a layout of the data cells.

4. The magnetic random access memory according to claim 2, wherein the axis of easy magnetization of the first and second reference cells is symmetrical to a line extending in the row direction.

5. The magnetic random access memory according to claim 4, wherein a layout of the first and second reference cells is different from a layout of the data cells.

6. The magnetic random access memory according to claim 4, wherein the directions of the first and second writing currents are the same.

7. The magnetic random access memory according to claim 2, wherein the directions of the first and second writing currents are different from each other.

8. The magnetic random access memory according to claim 2, wherein all easy-to-magnetize axes of the first and second reference cells are directed in the same direction, the first and second reference bit lines extend in the row direction while meandering, and the axis of easy magnetization of the first and second reference cells and the direction in which the first and second reference bit lines extend from an angle of θ (0<θ<90°).

9. The magnetic random access memory according to claim 8, wherein a layout of the first and second reference bit lines is different from a layout of bit lines for use in the data cells.

10. The magnetic random access memory according to claim 8, wherein the first and second reference bit lines are disposed symmetrically to a line extending in the row direction.

11. The magnetic random access memory according to claim 10, wherein a layout of the first and second reference bit lines is different from a layout of bit lines for use in the data cells.

12. The magnetic random access memory according to claim 10, wherein the directions of the first and second writing currents are the same.

13. The magnetic random access memory according to claim 8, wherein the directions of the first and second writing currents are different from each other.

14. The magnetic random access memory according to claim 1, wherein data "0" is stored in the first reference cells, and data "1" is stored in the second reference cells.

15. The magnetic random access memory according to claim 1, wherein the first and second writing currents are different from the writing currents for use in the data cells.

16. The magnetic random access memory according to claim 1, further comprising:
    a first sense amplifier which checks the data; and
    a second sense amplifier which determines a value of the data stored in the data cells.

17. A recovering method of data of reference cells of memory cells in a magnetic random access memory, the reference cells comprising magnetoresistive elements and sharing a reference bit line, the recovering method comprising:
    starting a mode of recovering data of the reference cells;
    checking the data of the reference cells one by one;
    executing data writing in all of the reference cells by a uniaxial writing when the data is broken; and
    terminating the mode after the data writing,
    wherein data writing is executed in a biaxial writing to data cells of the memory cells in the magnetic random access memory, the data cells comprising magnetoresistive elements.

18. The recovering method according to claim 17, wherein the reference cells are used in generation of a reference electric potential when determining a value of data of the data cells.

19. The recovering method according to claim 18, wherein operation for determining the value of the data of the memory cell is prohibited in the midst of execution of the mode.

* * * * *